(12) United States Patent
Woehlte

(10) Patent No.: US 10,782,388 B2
(45) Date of Patent: Sep. 22, 2020

(54) VEHICLE RADAR SYSTEM WITH COPPER PCB

(71) Applicant: MAGNA ELECTRONICS INC., Auburn Hills, MI (US)

(72) Inventor: Wilhelm Johann Wolfgang Woehlte, Sailauf (DE)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 294 days.

(21) Appl. No.: 15/897,268

(22) Filed: Feb. 15, 2018

(65) Prior Publication Data

US 2018/0231635 A1 Aug. 16, 2018

Related U.S. Application Data

(60) Provisional application No. 62/459,637, filed on Feb. 16, 2017.

(51) Int. Cl.
| | | |
|---|---|---|
| *G01S 7/03* | (2006.01) | |
| *G01S 13/931* | (2020.01) | |
| *H05K 1/11* | (2006.01) | |
| *H05K 1/02* | (2006.01) | |
| *G05D 1/02* | (2020.01) | |
| *H05K 3/46* | (2006.01) | |

(Continued)

(52) U.S. Cl.
CPC ............... *G01S 7/03* (2013.01); *G01S 13/931* (2013.01); *G05D 1/0257* (2013.01); *H01Q 1/02* (2013.01); *H01Q 1/3233* (2013.01); *H01Q 21/0006* (2013.01); *H05K 1/0243* (2013.01); *H05K 1/111* (2013.01); *H05K 3/4644* (2013.01); *G01S 2013/93275* (2020.01); *H01P 3/121* (2013.01); *H04B 1/04* (2013.01); *H04B 1/16* (2013.01); *H05K 1/09* (2013.01); *H05K 2201/10098* (2013.01); *H05K 2201/10151* (2013.01)

(58) Field of Classification Search
CPC ..... G01S 7/03; G01S 13/931; H01Q 21/0006; H01Q 21/0037; H05K 1/0243; H05K 3/4644; H01P 3/121; H01P 3/082; H01P 7/065

See application file for complete search history.

(56) References Cited

U.S. PATENT DOCUMENTS

| | | | |
|---|---|---|---|
| 5,949,331 A | | 9/1999 | Schofield et al. |
| 5,982,256 A | * | 11/1999 | Uchimura ............... H01P 1/047 333/239 |

(Continued)

FOREIGN PATENT DOCUMENTS

| | | |
|---|---|---|
| WO | 2011090484 A1 | 7/2011 |
| WO | 2018007995 A1 | 1/2018 |

*Primary Examiner* — Peter M Bythrow
(74) *Attorney, Agent, or Firm* — Honigman LLP

(57) ABSTRACT

A radar sensing system for a vehicle includes a radar sensor disposed at the vehicle so as to sense exterior of the vehicle. The radar sensor includes a plurality of transmitters that transmit radio signals and a plurality of receivers that receive radio signals. The received radio signals are transmitted radio signals that are reflected from an object. A processor is operable to process an output of the receivers. The radar sensor includes a printed circuit board having circuitry disposed thereat. The printed circuit board includes two HF-laminate layers and a copper layer disposed between the HF-laminate layers. At least one waveguide is established through the copper layer.

20 Claims, 2 Drawing Sheets

(51) Int. Cl.
*H01Q 1/32* (2006.01)
*H01Q 1/02* (2006.01)
*H01Q 21/00* (2006.01)
*H04B 1/04* (2006.01)
*H05K 1/09* (2006.01)
*H04B 1/16* (2006.01)
*H01P 3/12* (2006.01)

(56) References Cited

U.S. PATENT DOCUMENTS

| | | | |
|---|---|---|---|
| 6,154,176 A * | 11/2000 | Fathy | H01Q 1/38 |
| | | | 343/700 MS |
| 6,566,975 B2 * | 5/2003 | Kudo | H01P 3/081 |
| | | | 333/246 |
| 6,587,186 B2 | 7/2003 | Bamji et al. | |
| 6,674,895 B2 | 1/2004 | Rafii et al. | |
| 6,678,039 B2 | 1/2004 | Charbon | |
| 6,690,268 B2 | 2/2004 | Schofield et al. | |
| 6,690,354 B2 | 2/2004 | Sze | |
| 6,693,517 B2 | 2/2004 | McCarthy et al. | |
| 6,710,770 B2 | 3/2004 | Tomasi et al. | |
| 6,825,455 B1 | 11/2004 | Schwarte | |
| 6,876,775 B2 | 4/2005 | Torunoglu | |
| 6,906,793 B2 | 6/2005 | Bamji et al. | |
| 6,919,549 B2 | 7/2005 | Bamji et al. | |
| 7,053,357 B2 | 5/2006 | Schwarte | |
| 7,157,685 B2 | 1/2007 | Bamji et al. | |
| 7,176,438 B2 | 2/2007 | Bamji et al. | |
| 7,203,356 B2 | 4/2007 | Gokturk et al. | |
| 7,212,663 B2 | 5/2007 | Tomasi | |
| 7,283,213 B2 | 10/2007 | O'Connor et al. | |
| 7,310,431 B2 | 12/2007 | Gokturk et al. | |
| 7,321,111 B2 | 1/2008 | Bamji et al. | |
| 7,340,077 B2 | 3/2008 | Gokturk et al. | |
| 7,352,454 B2 | 4/2008 | Bamji et al. | |
| 7,375,803 B1 | 5/2008 | Bamji | |
| 7,378,599 B2 * | 5/2008 | Somei | H01Q 1/247 |
| | | | 174/255 |
| 7,379,100 B2 | 5/2008 | Gokturk et al. | |
| 7,379,163 B2 | 5/2008 | Rafii et al. | |
| 7,405,812 B1 | 7/2008 | Bamji | |
| 7,408,627 B2 | 8/2008 | Bamji et al. | |
| 7,580,795 B2 | 8/2009 | McCarthy et al. | |
| 8,013,780 B2 | 9/2011 | Lynam | |
| 8,027,029 B2 | 9/2011 | Lu et al. | |
| 8,159,316 B2 * | 4/2012 | Miyazato | G01S 7/032 |
| | | | 333/239 |
| 8,669,834 B2 * | 3/2014 | Cheng | H01P 3/121 |
| | | | 29/600 |
| 8,698,894 B2 | 4/2014 | Briggance | |
| 9,036,026 B2 | 5/2015 | Dellantoni et al. | |
| 9,123,979 B1 * | 9/2015 | Izadian | H01P 3/18 |
| 9,130,254 B1 * | 9/2015 | Izadian | H01P 11/002 |
| 9,142,872 B1 * | 9/2015 | Izadian | H01P 11/003 |
| 9,146,898 B2 | 9/2015 | Ihlenburg et al. | |
| 9,575,160 B1 | 2/2017 | Davis et al. | |
| 9,599,702 B1 | 3/2017 | Bordes et al. | |
| 9,689,967 B1 | 6/2017 | Stark et al. | |
| 9,753,121 B1 | 9/2017 | Davis et al. | |
| 9,806,431 B1 * | 10/2017 | Izadian | H01Q 13/10 |
| 9,851,763 B1 * | 12/2017 | Petrick | H05K 1/113 |
| 10,251,270 B2 * | 4/2019 | Xiong | H05K 1/115 |
| 10,468,736 B2 * | 11/2019 | Mangaiahgari | H01P 3/121 |
| 2003/0231078 A1 * | 12/2003 | Koriyama | H01L 23/66 |
| | | | 333/26 |
| 2004/0150554 A1 * | 8/2004 | Stenger | H01P 1/047 |
| | | | 342/175 |
| 2005/0045376 A1 * | 3/2005 | Lee | H01P 3/006 |
| | | | 174/255 |
| 2005/0225481 A1 * | 10/2005 | Bonthron | G01S 7/032 |
| | | | 342/175 |
| 2008/0012663 A1 * | 1/2008 | Chung | H01P 3/12 |
| | | | 333/239 |
| 2009/0066597 A1 * | 3/2009 | Yang | H01P 3/121 |
| | | | 343/771 |
| 2010/0001897 A1 | 1/2010 | Lyman | |
| 2010/0141350 A1 * | 6/2010 | Sasaki | H01P 3/121 |
| | | | 333/1.1 |
| 2010/0245066 A1 | 9/2010 | Sarioglu et al. | |
| 2011/0163919 A1 * | 7/2011 | Suzuki | H01Q 1/2283 |
| | | | 343/700 MS |
| 2012/0062743 A1 | 3/2012 | Lynam et al. | |
| 2012/0188030 A1 * | 7/2012 | Liu | H01P 5/107 |
| | | | 333/238 |
| 2012/0218412 A1 | 8/2012 | Dellantoni et al. | |
| 2013/0180763 A1 * | 7/2013 | Moul | H01P 3/088 |
| | | | 174/251 |
| 2013/0215271 A1 | 8/2013 | Lu | |
| 2013/0222592 A1 | 8/2013 | Gieseke | |
| 2014/0218529 A1 | 8/2014 | Mahmoud et al. | |
| 2014/0375476 A1 | 12/2014 | Johnson et al. | |
| 2015/0124096 A1 | 5/2015 | Koravadi | |
| 2015/0158849 A1 | 6/2015 | Koravadi | |
| 2015/0251599 A1 | 9/2015 | Koravadi | |
| 2015/0352953 A1 | 12/2015 | Koravadi | |
| 2016/0036917 A1 | 2/2016 | Koravadi et al. | |
| 2016/0210853 A1 | 7/2016 | Koravadi | |
| 2017/0129489 A1 | 5/2017 | Pawlicki et al. | |
| 2017/0222311 A1 | 8/2017 | Hess et al. | |
| 2017/0254873 A1 | 9/2017 | Koravadi | |
| 2017/0271761 A1 * | 9/2017 | Purden | H01P 5/103 |
| 2017/0276788 A1 | 9/2017 | Wodrich | |
| 2017/0315231 A1 | 11/2017 | Wodrich | |
| 2017/0356994 A1 | 12/2017 | Wodrich et al. | |
| 2018/0015875 A1 | 1/2018 | May et al. | |
| 2018/0027647 A1 * | 1/2018 | Rengarajan | H05K 1/0216 |
| | | | 342/175 |
| 2018/0045812 A1 | 2/2018 | Hess | |
| 2018/0059236 A1 | 3/2018 | Wodrich et al. | |
| 2018/0065623 A1 | 3/2018 | Wodrich et al. | |
| 2018/0067194 A1 | 3/2018 | Wodrich et al. | |
| 2018/0105176 A1 | 4/2018 | Pawlicki et al. | |
| 2018/0231657 A1 | 8/2018 | Woehlte | |
| 2018/0299533 A1 | 10/2018 | Pliefke et al. | |
| 2019/0058232 A1 * | 2/2019 | Fruehling | G04F 5/14 |
| 2019/0061760 A1 | 2/2019 | Pawlicki et al. | |
| 2019/0072666 A1 | 3/2019 | Biarge et al. | |
| 2019/0072667 A1 | 3/2019 | Biarge et al. | |
| 2019/0072668 A1 | 3/2019 | Biarge et al. | |
| 2019/0072669 A1 | 3/2019 | Biarge et al. | |
| 2019/0217775 A1 | 7/2019 | May et al. | |
| 2019/0219687 A1 * | 7/2019 | Baheti | A61B 5/02438 |

\* cited by examiner

VEHICLE RADAR SYSTEM WITH COPPER PCB

CROSS REFERENCE TO RELATED APPLICATION

The present application claims the filing benefits of U.S. provisional application Ser. No. 62/459,637, filed Feb. 16, 2017, which is hereby incorporated herein by reference in its entirety.

FIELD OF THE INVENTION

The present invention relates generally to a vehicle sensing system for a vehicle and, more particularly, to a vehicle sensing system that utilizes one or more radar sensors at a vehicle.

BACKGROUND OF THE INVENTION

Use of imaging and radar sensors in vehicle imaging systems is common and known. Examples of such known systems are described in U.S. Pat. No. 8,013,780, which is hereby incorporated herein by reference in its entirety.

SUMMARY OF THE INVENTION

The present invention provides a driving assistance system or sensing system or vehicle control system for a vehicle that utilizes one or more radar sensors to sense regions exterior of the vehicle, with the radar sensor that transmits and receives signals, with the received signals processed to detect the presence of objects at or near the vehicle in the field of sensing of the sensor. The radar sensor includes a printed circuit board (PCB) that comprises two High Frequency (HF)-laminate layers and a copper layer disposed between the HF-laminate layers, with at least one waveguide established through the copper layer. Preferably, the radar sensors of the present invention are used in conjunction with a plurality of image sensors mounted at the equipped vehicle and more preferably with at least one lidar sensor also mounted (along with the image sensors and the radar sensor) at the equipped vehicle. Image data and radar data and lidar data are preferably provided to a central electronic control unit (ECU) or module for processing thereat.

These and other objects, advantages, purposes and features of the present invention will become apparent upon review of the following specification in conjunction with the drawings.

DESCRIPTION OF THE PREFERRED EMBODIMENTS

A vehicle sensing system and/or driver assist system and/or driving assist system and/or object detection system and/or alert system operates to capture sensing data exterior of the vehicle and may process the captured data to detect objects at or near the vehicle and in the predicted path of the vehicle, such as to assist a driver of the vehicle or a control for an autonomous vehicle in maneuvering the vehicle in a forward or rearward direction. The system includes a processor that is operable to receive sensing data from one or more sensors and provide an output, such as an alert or control of a vehicle system.

Figure 1:
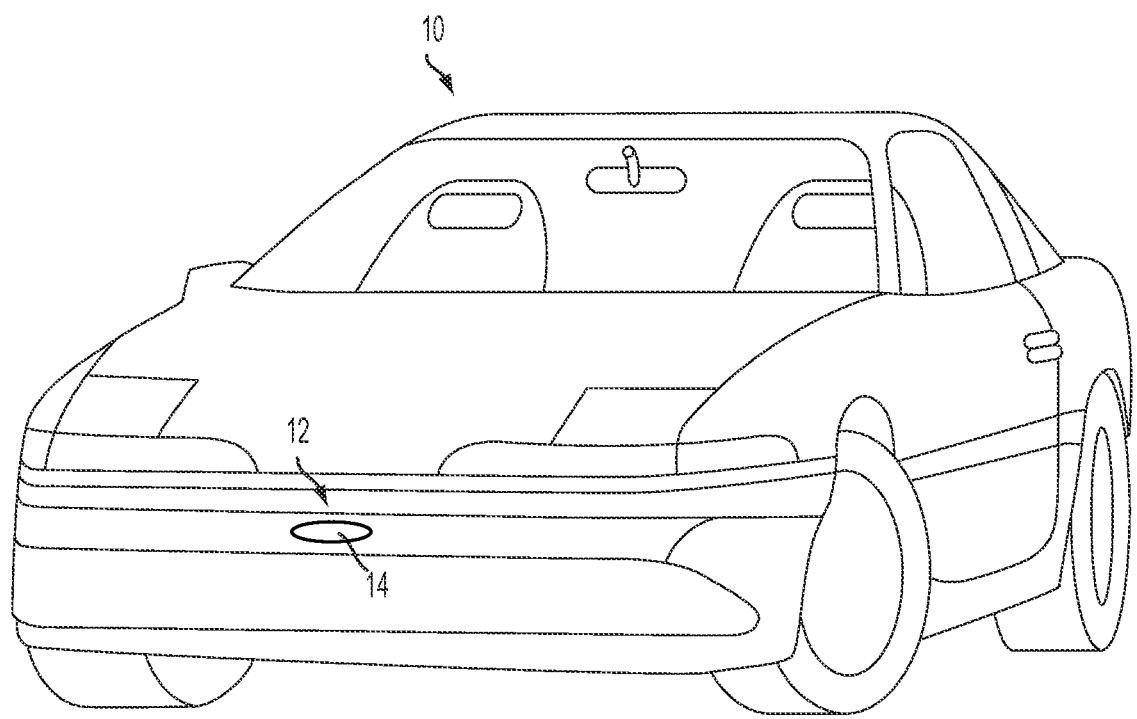
FIG. 1 is a perspective view of a vehicle with a sensing system that incorporates a radar sensor in accordance with the present invention.

Referring now to the drawings and the illustrative embodiments depicted therein, a vehicle 10 (FIG. 1) includes an driving assistance system or sensing system 12 that includes at least one radar sensor unit, such as a forward facing radar sensor unit 14 (and the system may optionally include multiple exterior facing sensors, such as cameras or other sensors, such as a rearward facing sensor at the rear of the vehicle, and a sideward/rearward facing sensor at respective sides of the vehicle), which sense regions exterior of the vehicle. The sensing system 12 includes a control or electronic control unit (ECU) or processor that is operable to process data captured by the sensor or sensors and may detect objects or the like. The data transfer or signal communication from the sensor to the ECU may comprise any suitable data or communication link, such as a vehicle network bus or the like of the equipped vehicle.

The radar sensor or sensors of the driving assist system may be used in conjunction with a plurality of image sensors mounted at the equipped vehicle and/or with at least one lidar sensor also mounted (along with the image sensors and the radar sensor) at the equipped vehicle. Image data and radar data and lidar data are provided to a central electronic control unit (ECU) or module for processing thereat. The ECU includes at least one processor that processes the captured/sensed data, whereby one or more functions or systems (such as a braking system and/or steering system and/or the like) of the vehicle is controlled responsive to processing of the captured/sensed data.

The system includes one or more transmitter antennas and one or more receiver antennas, which are disposed on a printed circuit board (PCB) that includes associated circuitry. The PCB may comprise a multi-layer PCB. Some of today's automotive radars use waveguides for the transition of high-frequency signals from one layer of the PCB to another. This is not done with a single PCB. Instead, these systems have at least three PCBs which are glued together (such as shown in FIG. 2).

Figure 2:
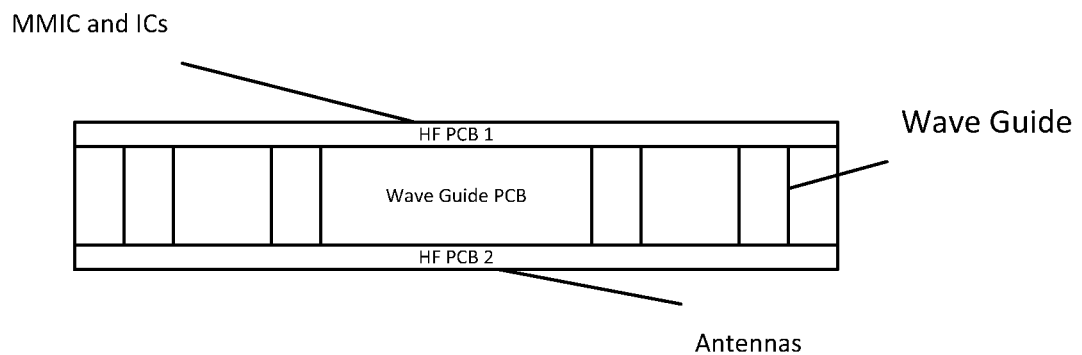
FIG. 2 is a sectional view of a printed circuit board suitable for use in a vehicle radar sensing system.

As shown in FIG. 2, these systems typically comprise a multi-layer PCB comprising two HF-PCBs and one waveguide PCB. The first HF-PCB is the carrier PCB for the Monolithic Microwave Integrated Circuits (MMICs). A transition line is used to connect the MMIC to a patch. This signal line is used for the high-frequency signal. The patch may be disposed over an opening of a hole in the waveguide PCB. This hole is metalized and acts as a waveguide. The high-frequency signal is coupled into the waveguide (aperture coupling) and exits the hole on the other side of the waveguide PCB nearly free of losses.

On the exit side, any antenna structure can be used. The signals couple from the waveguide into the antenna structure and can radiate. This works in both directions as receiver and as transmitter.

The system and PCB configuration of the present invention limits or avoids the three PCB concept. The waveguide needs a certain geometry that also depends on the frequency which needs to be guided. Also care needs to be taken that the signal is not disturbed or coupled to other signals.

Figure 3:
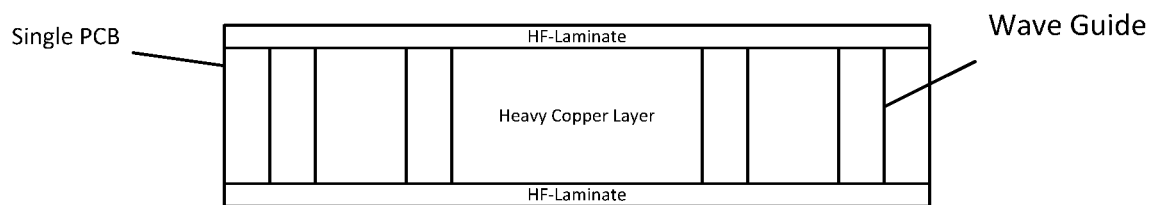
FIG. 3 is a sectional view of a printed circuit board comprising a copper portion in accordance with the present invention.

The PCB of the present invention (FIG. 3) uses a heavy copper layer PCB and realizes the waveguide within the thick copper layer as an alternative to multiple PCBs. The exact thickness and shape of the waveguide may be adjusted to correspond to a desired frequency and use case. The top and bottom layer of this single PCB are HF-laminate layers, which are used to connect the MMICs to the coupling patch. Aperture coupling is used for the transition from pads on the HF-laminate layers to the waveguide which is basically a dedicated hole in the heavy copper layer. And on the second side aperture coupling is used again to couple the signal from the waveguide to the antenna structure. The antenna side also has HF-laminate in usage.

The use of just one PCB eliminates the expensive glue process typically used to bond or adhere multiple layers or PCBs together. Thus, the present invention lowers the costs (no glue needed) and simplifies manufacturing because no tight alignment between the different PCBs is needed. Instead, only the alignment during the PCB manufacturing is needed.

Also, any antenna structure (or antenna array) can be fed by this technique.

Another benefit or advantage of the PCB of the present invention is the heat transfer function. The heavy copper layer can be used for heat spreading as well. Radar applications can have a quite large power consumption and heat dissipation needs be taken into account. The heavy copper layer provides enhanced heat transfer and is not heat saturated as fast as thin copper layers. This improves the signal quality and overcomes mechanical issues like thermal expansion. This expanding can have a negative influence on the antenna.

The sensing system may utilize aspects of the systems described in U.S. Pat. Nos. 8,027,029; 8,013,780; 6,825,455; 7,053,357; 7,408,627; 7,405,812; 7,379,163; 7,379,100; 7,375,803; 7,352,454; 7,340,077; 7,321,111; 7,310,431; 7,283,213; 7,212,663; 7,203,356; 7,176,438; 7,157,685; 6,919,549; 6,906,793; 6,876,775; 6,710,770; 6,690,354; 6,678,039; 6,674,895 and/or 6,587,186, and/or International Publication Nos. WO 2018/007995 and/or WO 2011/090484, and/or U.S. Publication Nos. US-2018-0015875; US-2017-0356994; US-2017-0315231; US-2017-0276788; US-2017-0254873; US-2017-0222311 and/or US-2010-0245066, and/or U.S. patent application Ser. No. 15/675,919, filed Aug. 14, 2017 and published Feb. 15, 2018 as U.S. Publication No. US-2018-0045812, and/or Ser. No. 15/897,295, filed Feb. 15, 2018 and published Aug. 16, 2018 as U.S. Publication No. US-2018-0231657, which are all hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A radar sensing system for a vehicle, said radar sensing system comprising:
a radar sensor disposed at the vehicle so as to sense exterior of the vehicle;
wherein said radar sensor comprises a plurality of transmitters that transmit radio signals, and a plurality of receivers that receive radio signals, and wherein the received radio signals are transmitted radio signals that are reflected from an object;
a processor operable to process outputs of said receivers;
wherein said radar sensor comprises a printed circuit board;
wherein said printed circuit board comprises a first layer and a second layer with a copper layer disposed between said first and second layers, and wherein at least one waveguide is established through said copper layer;
wherein circuitry is disposed at said first layer and antenna structure is disposed at said second layer; and
wherein the copper layer spans between and contacts opposed surfaces of said first and second layers, and wherein said first layer is laminated to a first side of said copper layer and said second layer is laminated to a second side of said copper layer to form a single printed circuit board.

2. The radar sensing system of claim 1, wherein said transmitters and receivers are disposed at said printed circuit board.

3. The radar sensing system of claim 1, wherein said first and second layers comprise a plurality of pads, and wherein aperture coupling is used as a transition from the pads to the at least one waveguide.

4. The radar sensing system of claim 1, wherein aperture coupling is used to couple the at least one waveguide to the antenna structure at said second layer.

5. The radar sensing system of claim 1, wherein said first and second layers and the copper layer are joined without the use of adhesives.

6. The radar sensing system of claim 1, wherein said first and second layers comprise High Frequency (HF) first and second layers.

7. The radar sensing system of claim 1, wherein said processor processes the outputs of said receivers to detect an object exterior the vehicle.

8. The radar sensing system of claim 7, wherein said processor is part of a driving assist system, and wherein said driving assist system controls at least one function of the vehicle responsive to said processor processing the outputs of said receivers.

9. A radar sensing system for a vehicle, said radar sensing system comprising:
a radar sensor disposed at the vehicle so as to sense exterior of the vehicle;
wherein said radar sensor comprises a plurality of transmitters that transmit radio signals, and a plurality of receivers that receive radio signals, and wherein the received radio signals are transmitted radio signals that are reflected from an object;
a processor operable to process outputs of said receivers;
wherein said radar sensor comprises a printed circuit board;
wherein said printed circuit board comprises first and second High Frequency (HF) laminate layers and a copper layer disposed between said first and second HF laminate layers, and wherein the first and second HF laminate layers and the copper layer are joined without the use of adhesives, and wherein at least one waveguide is established through said copper layer;
wherein circuitry is disposed at said first HF laminate layer and antenna structure is disposed at said second HF laminate layer; and
wherein the copper layer spans between and contacts opposed surfaces of said first and second HF laminate layers, and wherein said first HF laminate layer is joined to a first side of said copper layer and said second HF laminate layer is joined to a second side of said copper layer to form a single printed circuit board.

10. The radar sensing system of claim 9, wherein said transmitters and receivers are disposed at said printed circuit board.

11. The radar sensing system of claim 9, wherein said first and second HF laminate layers comprise a plurality of pads, and wherein aperture coupling is used as a transition from the pads to the at least one waveguide.

12. The radar sensing system of claim 9, wherein aperture coupling is used to couple the at least one waveguide to the antenna structure at said second HF laminate layer.

13. The radar sensing system of claim 9, wherein said processor processes the outputs of said receivers to detect an object exterior the vehicle.

14. The radar sensing system of claim 13, wherein said processor is part of a driving assist system, and wherein said driving assist system controls at least one function of the vehicle responsive to said processor processing the outputs of said receivers.

15. A radar sensing system for a vehicle, said radar sensing system comprising:
 a radar sensor disposed at the vehicle so as to sense exterior of the vehicle;
 wherein said radar sensor comprises a plurality of transmitters that transmit radio signals, and a plurality of receivers that receive radio signals, and wherein the received radio signals are transmitted radio signals that are reflected from an object;
 a processor operable to process outputs of said receivers;
 wherein said radar sensor comprises a printed circuit board;
 wherein said printed circuit board comprises first and second High Frequency (HF) laminate layers and a copper layer disposed between said first and second HF laminate layers;
 wherein circuitry is disposed at said first HF laminate layer and antenna structure is disposed at said second HF laminate layer;
 wherein the copper layer spans between and contacts opposed surfaces of said first and second HF laminate layers, and wherein said first HF laminate layer is laminated to a first side of said copper layer and said second HF laminate layer is laminated to a second side of said copper layer to form a single printed circuit board; and
 wherein said processor processes the outputs of said receivers to detect an object exterior the vehicle.

16. The radar sensing system of claim 15, wherein said transmitters and receivers are disposed at said printed circuit board.

17. The radar sensing system of claim 16, wherein said first and second HF laminate layers comprise a plurality of pads, and wherein aperture coupling is used as a transition from the pads to at least one waveguide established through the copper layer.

18. The radar sensing system of claim 16, wherein aperture coupling is used to couple the antenna structure to at least one waveguide established through the copper layer at said second HF laminate layer.

19. The radar sensing system of claim 15, wherein said first and second HF laminate layers and the copper layer are joined without the use of adhesives.

20. The radar sensing system of claim 15, wherein said processor is part of a driving assist system, and wherein said driving assist system controls at least one function of the vehicle responsive to said processor processing the outputs of said receivers.

* * * * *